United States Patent
Sakura et al.

(10) Patent No.: US 8,153,953 B2
(45) Date of Patent: Apr. 10, 2012

(54) LIGHT RECEIVING CIRCUIT

(75) Inventors: Shigeyuki Sakura, Kawasaki (JP); Hirofumi Kobayashi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 776 days.

(21) Appl. No.: 12/236,566

(22) Filed: Sep. 24, 2008

(65) Prior Publication Data

US 2009/0084942 A1    Apr. 2, 2009

(30) Foreign Application Priority Data

Sep. 28, 2007   (JP) ................. 2007-256445

(51) Int. Cl.
*H03F 3/08* (2006.01)

(52) U.S. Cl. .............. 250/214 A; 250/214 LA; 330/254; 330/308

(58) Field of Classification Search ............. 250/214 A, 250/214 LA; 330/254, 308
See application file for complete search history.

(56) References Cited

U.S. PATENT DOCUMENTS

| | | | |
|---|---|---|---|
| 4,291,223 A | 9/1981 | Sakane et al. | |
| 4,636,053 A | 1/1987 | Sakane et al. | |
| 4,642,551 A * | 2/1987 | Miller | 323/314 |
| 5,767,538 A * | 6/1998 | Mullins et al. | 257/115 |
| 5,796,689 A | 8/1998 | Houmoto et al. | |
| 6,396,351 B1 * | 5/2002 | Buescher et al. | 330/308 |
| 7,190,227 B2 * | 3/2007 | Gilbert | 330/254 |
| 2002/0105377 A1 | 8/2002 | Masuda et al. | |
| 2002/0109075 A1 | 8/2002 | Ono | |
| 2003/0016084 A1 * | 1/2003 | Scott et al. | 330/308 |
| 2003/0222696 A1 | 12/2003 | Ono | |
| 2004/0056181 A1 | 3/2004 | Ono | |
| 2005/0133691 A1 * | 6/2005 | Doppke et al. | 250/214 A |
| 2005/0258885 A1 | 11/2005 | Ono | |
| 2006/0220747 A1 | 10/2006 | Kiji | |
| 2007/0109056 A1 * | 5/2007 | Kwa et al. | 330/308 |
| 2007/0126507 A1 | 6/2007 | Sakura | |
| 2008/0179496 A1 | 7/2008 | Sakura et al. | |
| 2008/0230683 A1 | 9/2008 | Uo et al. | |

FOREIGN PATENT DOCUMENTS

| | | |
|---|---|---|
| GB | 2017446 | 10/1979 |
| GB | 2101830 | 1/1983 |
| JP | 55018123 | 2/1980 |
| JP | 06303048 | 10/1994 |
| JP | 07-321565 | 12/1995 |
| JP | 10027356 | 1/1998 |
| JP | 10-242772 | 9/1998 |
| JP | 2001285037 | 10/2001 |
| JP | 2002158549 | 5/2002 |
| JP | 2002232271 | 8/2002 |
| JP | 2005210147 | 8/2005 |
| JP | 2006-262410 | 9/2006 |

* cited by examiner

*Primary Examiner* — Georgia Y Epps
*Assistant Examiner* — Kevin Wyatt
(74) *Attorney, Agent, or Firm* — Turocy & Watson, LLP

(57) ABSTRACT

A light receiving circuit includes: a transimpedance amplifier circuit which is connected to a light receiving element; a differential amplifier which operates by a predetermined current supplied by a current source to output a current corresponding to a differential signal between a signal outputted from the transimpedance amplifier circuit and a predetermined reference signal; a current mirror unit which outputs a current corresponding to the current outputted from the differential amplifier; and a conversion unit which converts the current outputted from the current mirror unit into voltage.

18 Claims, 5 Drawing Sheets

LIGHT RECEIVING CIRCUIT

CROSS-REFERENCE TO RELATED APPLICATIONS

This application is based upon and claims the benefit of priority from the prior Japanese Patent Application No. 2007-256445, filed on Sep. 28, 2007; the entire contents of which are incorporated herein by reference.

BACKGROUND OF THE INVENTION

1. Field of the Invention

The present invention relates to a light receiving circuit which converts an optical signal into an electrical digital signal and outputs it.

2. Description of the Related Art

A light receiving circuit which amplifies a signal received by a light receiving element is used in various applications including optical communication (see, for example, JP-A 07-321565(KOKAI)). However, a reduction in power consumption of the light receiving circuit is demanded. For example, if the logic element in the light receiving circuit can be composed of a CMOS element, the power consumption can be easily reduced. However, use of the CMOS element makes it difficult to cope with the power supply voltage within a wide range because of its low withstand voltage.

BRIEF SUMMARY OF THE INVENTION

An object of the present invention is to provide a light receiving circuit which easily realizes both a reduction in power consumption and coping with the power supply voltage within a wide range.

A light receiving circuit according to an aspect of the present invention includes: a transimpedance amplifier circuit which is connected to a light receiving element; a current source which supplies a predetermined current; a differential amplifier which operates by the predetermined current to output a current corresponding to a differential signal between a signal outputted from the transimpedance amplifier circuit and a predetermined reference signal; a current mirror unit which outputs a current corresponding to the current outputted from the differential amplifier; and a conversion unit which converts the current outputted from the current mirror unit into voltage.

DETAILED DESCRIPTION OF THE INVENTION

Figure 1:
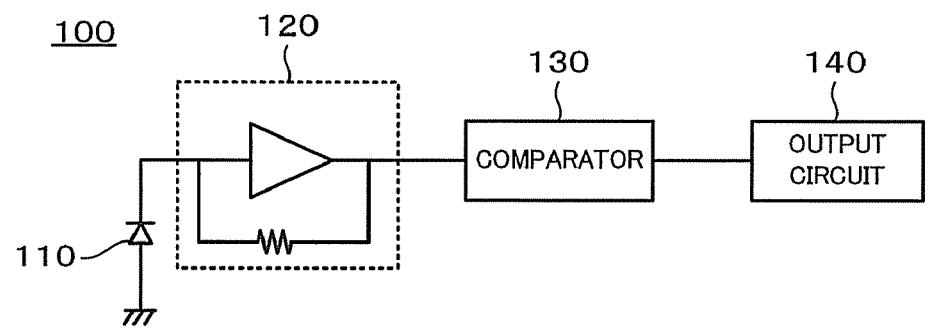
FIG. 1 is a diagram showing a light receiving circuit according to an embodiment of the present invention.

Hereinafter, embodiments of the present invention will be described. FIG. 1 is a diagram showing a light receiving circuit 100 according to an embodiment of the present invention. The light receiving circuit 100 has a light receiving element 110, an amplifier circuit 120, a comparator 130, and an output circuit 140. The light receiving element 110 receives, for example, pulsed light corresponding to a digital signal and outputs a signal. The amplifier circuit 120 amplifies the signal outputted from the light receiving element 110. The signals amplified by the amplifier circuit 120 are converted to digital signals by the comparator 130 and the output circuit 140.

(Configuration of Light Receiving Element 110)

Figure 2:
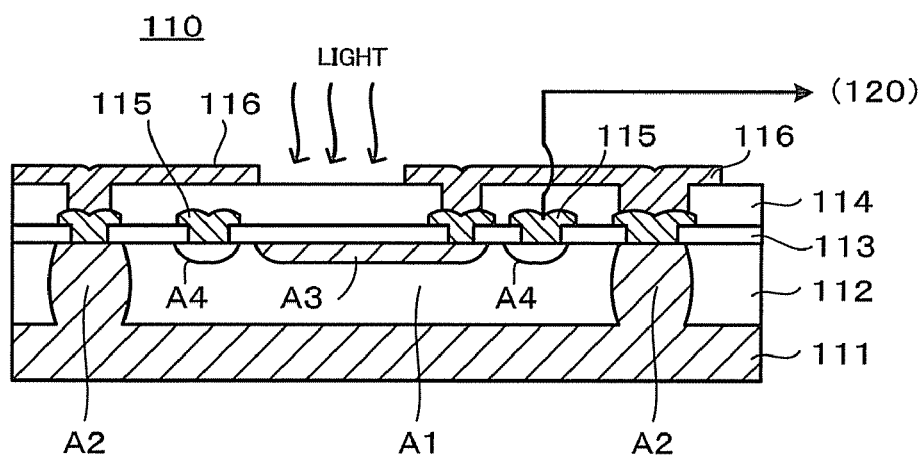
FIG. 2 is a sectional view showing an example of the configuration of a light receiving element.

FIG. 2 is a sectional view showing an example of the configuration of the light receiving element 110. The light receiving element 110 has a semiconductor substrate 111, a semiconductor layer 112, transparent insulating layers 113 and 114, and wiring conductors 115 and 116. The semiconductor substrate 111, the semiconductor layer 112, and the transparent insulating layers 113 and 114 are layered in order.

The semiconductor substrate 111 is made by diffusing impurities in a semiconductor material and has a first conductive type (for example, P type).

The semiconductor layer 112 is disposed on the semiconductor substrate 111 and divided into regions A1 and A2. The region A1 has a second conductive type (for example, N type). The region A2 is a region which is disposed around the region A1 and has a first conductive type (for example, P type) formed by impurity implantation or diffusion, and is connected to the semiconductor substrate 111 of the first conductive type. Within the region A1, a region A3 of the first conductive type (for example, P type) is disposed which is formed by impurity implantation or diffusion. The region A3 is not in contact with the semiconductor substrate 111. Between the regions A2 and A3, a fourth region A4 of the second conductive type (for example, N+ type) is disposed.

The transparent insulating layer 113, which is made of a transparent insulating material such as $SiO_2$ or the like, electrically separates the semiconductor layer 112 from the wiring conductor 115 and allows ambient light to be incident on the region A3 of the semiconductor layer 112. The transparent insulating layer 114, which is made of a transparent insulating material such as $SiO_2$ or the like, electrically separates the wiring conductors 115 and 116 from each other and allows ambient light to be incident on the region A3 of the semiconductor layer 112.

The wiring conductor 115, which is composed of a conductor such as metal or the like, penetrates the transparent insulating layer 113 and connects with the region A1 via the region A4 of the semiconductor layer 112. The wiring conductor 115 is connected to the amplifier circuit 120 at the subsequent stage.

The wiring conductor 116, which is composed of a conductor such as metal or the like, is disposed on the entire surface of the transparent insulating layer 114 except the region A3. The wiring conductor 116 connects the regions A2 and A3 and is connected to the ground (GND). As a result, the wiring conductor 116 shields the surface other than the region A3 to prevent electromagnetic noise from flowing thereinto. The electromagnetic noise entering into the light receiving region of the region A3 flows into the ground (GND) via the wiring conductor 116. Therefore, the noise is removed from the signal transmitted to the amplifier circuit 120 at the subsequent stage.

The region A1 of the semiconductor layer 112 is biased both on the light receiving surface side and the substrate side (the region A3 of the semiconductor layer 112 and the semiconductor substrate 111). This causes the depletion layer in the semiconductor layer 112 to extend more than in the case in which the region is biased on one side so as to increase the conversion efficiency from light to current.

In general, there is possibility that in the light receiving circuit, noise is mixed from the signal input side to cause a malfunction. Countermeasures against that include providing an electric shield in the amplifier of the light receiving circuit to flow the noise to the ground (GND) of the light receiving circuit. On the other hand, noise can flow into the amplifier via the light receiving element. Because of a relatively large area of the light receiving element, noise can often flow into the amplifier. In other words, shielding not only the amplifier but also the light receiving element can improve the noise tolerance.

In the light receiving element 110, the region A3 and the wiring conductor 116 shield the light receiving element 110 to thereby improve the noise tolerance. A typical conductor such as metal or the like can be used as the wiring conductor 116 to enable manufacture at a low cost. Shielding using a transparent conductive film (ITO) results in increased process and cost.

(Configuration of Amplifier Circuit 120)

Figure 3:
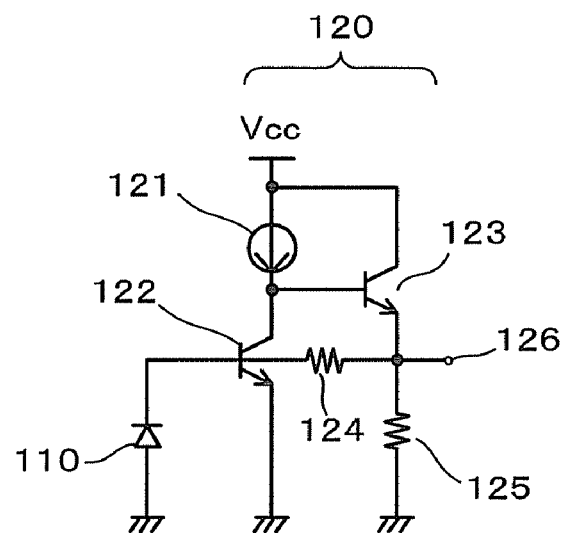
FIG. 3 is a circuit diagram showing an example of the configuration of an amplifier circuit.

FIG. 3 is a circuit diagram showing an example of the configuration of the amplifier circuit 120. The amplifier circuit 120, which is a transimpedance amplifier (an inverting amplifier), has a current source load 121, transistors 122 and 123, and resistors 124 and 125.

The current source load 121 has one end connected to a power supply Vcc and the other end connected to the collector of the transistor 122 and the base of the transistor 123.

The transistor 122 is a bipolar transistor (three-terminal element) constituting a grounded-emitter amplifier. An FET (Field Effect Transistor) may be used as the three-terminal element in place of the transistor 122 to constitute a grounded-source amplifier.

The transistor 123 is a bipolar transistor (three-terminal element) constituting an emitter follower. An FET (Field Effect transistor) may be used as the three-terminal element in place of the transistor 123 to constitute a source follower.

The resistor 124 is a feedback resistor to constitute a feedback circuit. The resistor 124 has one end and the other end connected to the emitter of the transistor 123 (the output of the emitter follower) and the light receiving element 110 and the base of the transistor 122, respectively.

The resistor 125 connects the emitter of the transistor 123 and the ground to cause the transistor 123 to operate as the emitter follower. Note that the resistor 125 may be replaced with the current source load.

A case is discussed in which a resistor RL is used in place of the current source load 121. In this case, noise flows into the transistor 122 from the power supply VCC via the resistor RL. Here, increasing the value of the resistor RL can prevent entry of the noise. However, in the case where the amplifier circuit 120 is constituted of an integrated circuit, a large area is required to obtain a large resistance value, leading to an increase in area of the integrated circuit.

Further, in the case of using the resistor RL, the current value flowing through the transistor 122 greatly varies if the power supply voltage Vcc in use is within a large range. In particular, when the power supply voltage Vcc is high, an operation current Icc becomes large to increase the power consumption. Hence, it is conceivable here that the power supply voltage Vcc is connected not directly to the transistor 122 but via a regulator (a voltage regulator such as a stabilized power supply or the like). In this event, to ensure the dynamic range, it is desired to make the supply voltage to the transistor 122 high to some extent even when the power supply voltage Vcc is low. However, regulation to make the supply voltage to the transistor 122 high causes to increase the lower limit of the operable power supply voltage Vcc.

In this embodiment, the current source load 121 is used to reduce the noise entering from the power supply Vcc to decrease the possibility of the malfunction due to the noise. The current source load 121 generally has a high impedance, which is equivalent to a high resistance, and therefore can decrease the influence of the power supply noise.

Even if the power supply voltage Vcc changes, the current source load 121 supplies a constant current. Therefore, even if the power supply voltage Vcc increases, the current flowing through the transistor 122 is suppressed to enable a reduction in power consumption. In other words, both the operation with a power supply voltage within a wide range and the reduction in power consumption can be achieved with ease. In addition, the necessity to add a regulator is eliminated to simplify the circuit configuration, thereby facilitating a decrease in area.

When the power supply voltage Vcc is within a wide range, the radiation noise caused by switching at the output circuit 140 at the subsequent stage can fall within a wider band. However, as has been described, shielding the light receiving element 110 with the region A3 and the wiring conductor 116 prevents the entry of the radiation noise to the light receiving element 110.

(Modification Examples of Configuration of Amplifier Circuit 120)

Generally, a parasitic capacitance exists in the light receiving element 110 and the current source load 121. Therefore, the band of the output of the light receiving circuit 100 shifts to the lower frequency side, with which its high speed operation can be interfered. Further, in synchronization with the rise or fall of the output waveform from the amplifier circuit 120, ringing can occur. In this case, when the output waveform exceeds the reference voltage of the comparator 130 at the stage subsequent to the amplifier circuit 120 due to the ringing, the polarity is inverted to cause a malfunction.

Figure 4:
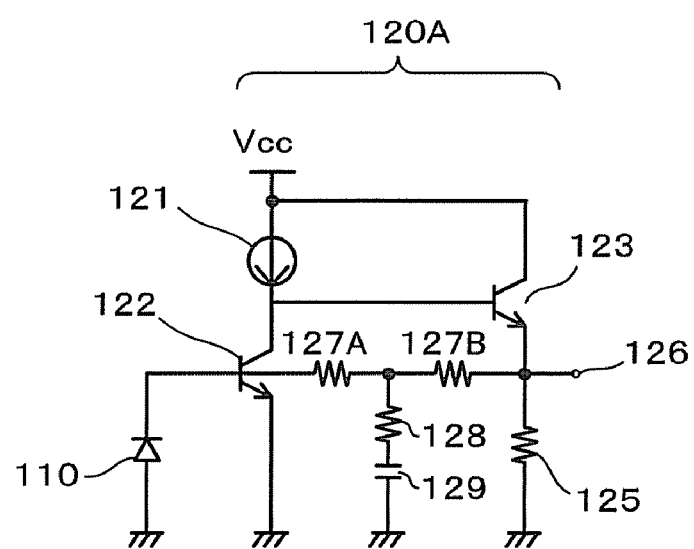
FIG. 4 is a circuit diagram showing a modification example of the configuration of the amplifier circuit.

FIG. 4 is a circuit diagram showing a configuration of an amplifier circuit 120A being a modification example of the amplifier circuit 120. The amplifier circuit 120A has resistors 127A, 127B, and 128 and a capacitor 129, in place of the resistor 124. Note that an FET may be used as the three-terminal element in place of the transistor 122 to constitute a grounded-source amplifier. An FET may be used as the three-terminal element in place of the transistor 123 to constitute a source follower.

Between a connection point of the resistors 127A and 127B and the ground potential, the resistor 128 and the capacitor 129 are connected in series. Note that similarly to the amplifier circuit 120, the resistor 125 may be replaced with a current source load.

Transmission characteristics of the amplifier circuit 120A will be discussed below. Here, the transistors 122 and 123 have ideal amplification characteristics and the junction capacitance of the light receiving element 110 is ignored for simplicity.

The amplification characteristics (vo/i) can be expressed by the following Expression (1).

$$vo/i = (R1+R2)(1+j\cdot\omega\cdot C\cdot(R3+R1*R2/(R1+R2))/(1+j\cdot\omega\cdot C\cdot R3)$$

Expression (1)

i: the current flowing from the light receiving element 110
vo: the output voltage of the amplifier circuit 120A
R1 to R3: the resistance values of the resistors 127A, 127B, and 128
C: the capacitance of the capacitor 129

Figure 5:
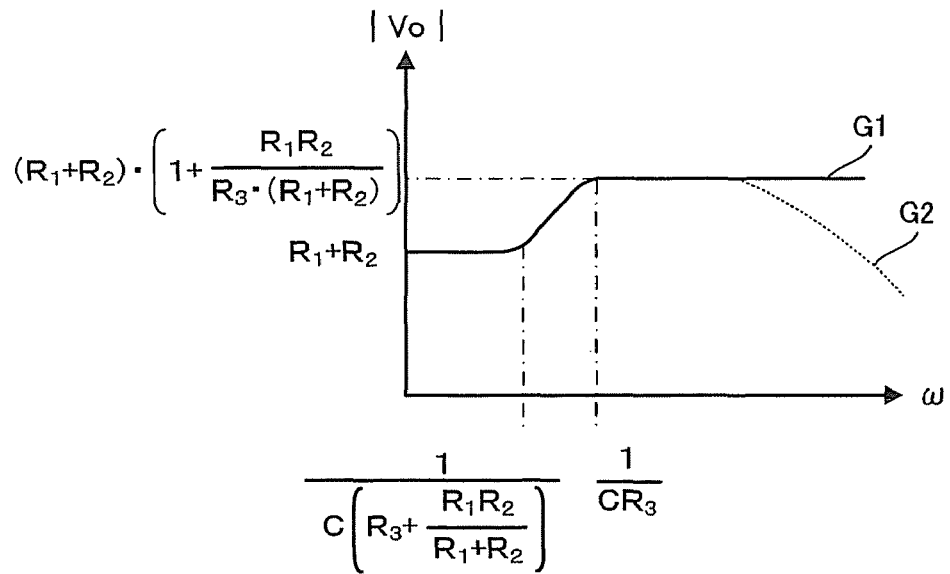
FIG. 5 is graphs showing the angular frequency-amplitude characteristics.

FIG. 5 is graphs showing the angular frequency-amplitude characteristics. A graph G1 in this chart indicates the correspondence of the amplitude |Vo| to the angular frequency ω in Expression (1). With the reference angular frequency ω1 (=C·(R3+1*R2/(R1+R2))) and ω2 (=C·R3) as boundaries, the amplification factor is lower on the low frequency side and the amplification factor is higher on the high frequency side. Note that the amplification factor actually lowers in the high frequency region as shown by the graph G2 because of the frequency characteristics of the transistors 122 and 123 and the influence of the junction capacitance of the light receiving element 110.

Figure 6:
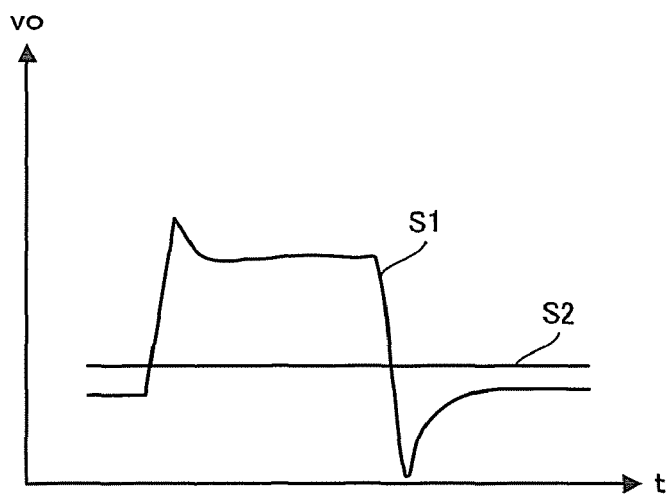
FIG. 6 is a chart showing an example of an output signal from the amplifier circuit.

FIG. 6 is a chart showing an example of the output signal from the amplifier circuit 120A. A waveform S1 indicates an example of the pulse waveform outputted from the amplifier circuit 120A. As has been described, the amplifier circuit 120A has the characteristic as shown by the graph G1 and thus has a amplification factor lower on the low frequency side. Therefore, the amplitude is small at a flat part of the waveform S1, and is large at rise and fall (having a sag). Accordingly, the amplitude at the fall portion is brought to much lower than that of the reference voltage Vst (a waveform S2) at the later-described comparator 130. This eventually prevents the output voltage from exceeding the reference voltage Vst (the waveform S2) near the fall of the waveform.

Since the amplifier circuit 120A operates at a high speed owing to short rise and fall times, the pulse width distortion of the output waveform of the comparator 130 is small even if the value of the reference voltage (the waveform S2) varies. Further, that the output waveform exceeds the reference voltage Vst (the waveform S2), that is, the malfunction is reduced owing to the ringing in synchronization with the fall time.

When the minimum width of the pulse waveform flowing from the light receiving element 110 into the amplifier circuit 120A is tw [sec], it is preferable here to determine the values of the resistors R1, R2, and R3 and the capacitor C as the following Expression (2).

$$C\cdot R3 < C\cdot(1+(R1\cdot R2/(R1+R2))) < tw$$

Expression (2)

By defining the resistor R1 by Expression (2), the pulse waveform distortion can be effectively prevented.

(Configuration of Comparator 130)

Figure 7:
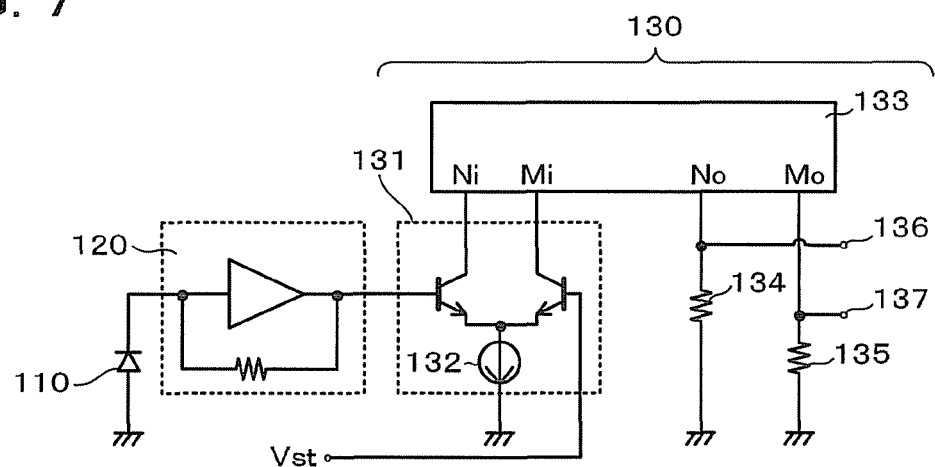
FIG. 7 is a circuit diagram showing an example of the configuration of a comparator.

FIG. 7 is a circuit diagram showing an example of the configuration of the comparator 130. The comparator 130 is connected to the stage subsequent to the amplifier circuit 120, and has a differential amplifier 131, a current source 132, a current mirror unit 133, resistors 134 and 135, and output terminals 136 and 137. Note that the amplifier circuit 120 may be the amplifier circuit 120A.

The differential amplifier 131 amplifies the difference between an output voltage V from the amplifier circuit 120 and the reference voltage Vst. The differential amplifier 131 is composed of two three-terminal elements (bipolar transistors or FETS) and flows currents In0 and Im0 corresponding to the difference between the output voltage V and the reference voltage Vst to input ends Ni and Mi of the current mirror unit 133. Setting is made such that the output voltage V has a pulse waveform at voltages Vh and V1 and the reference voltage Vst has a value between the voltages Vh and V1. This setting allows the current In0 to flow and substantially no current Im0 to flow (a combination of the current In0 and Im0 being H and L) when the output voltage V is Vh. On the other hand, when the output voltage V is V1, substantially no current In0 flows and the current Im0 flows (a combination of the current In0 and Im0 being L and H). More specifically, the differential amplifier 131 compares the output voltage V to the reference voltage Vst to thereby binarize the output voltage V as the current In0 (or the current Im0). Further, the currents In0 and Im0 at the input ends Ni and Mi are inverted to each other.

The current source 132 is connected to the emitter or the source of the differential amplifier 131 and supplies current independent of the power supply voltage Vcc. In other words, the differential amplifier 131 can cope with the power supply voltage within a wide range.

Figure 8:
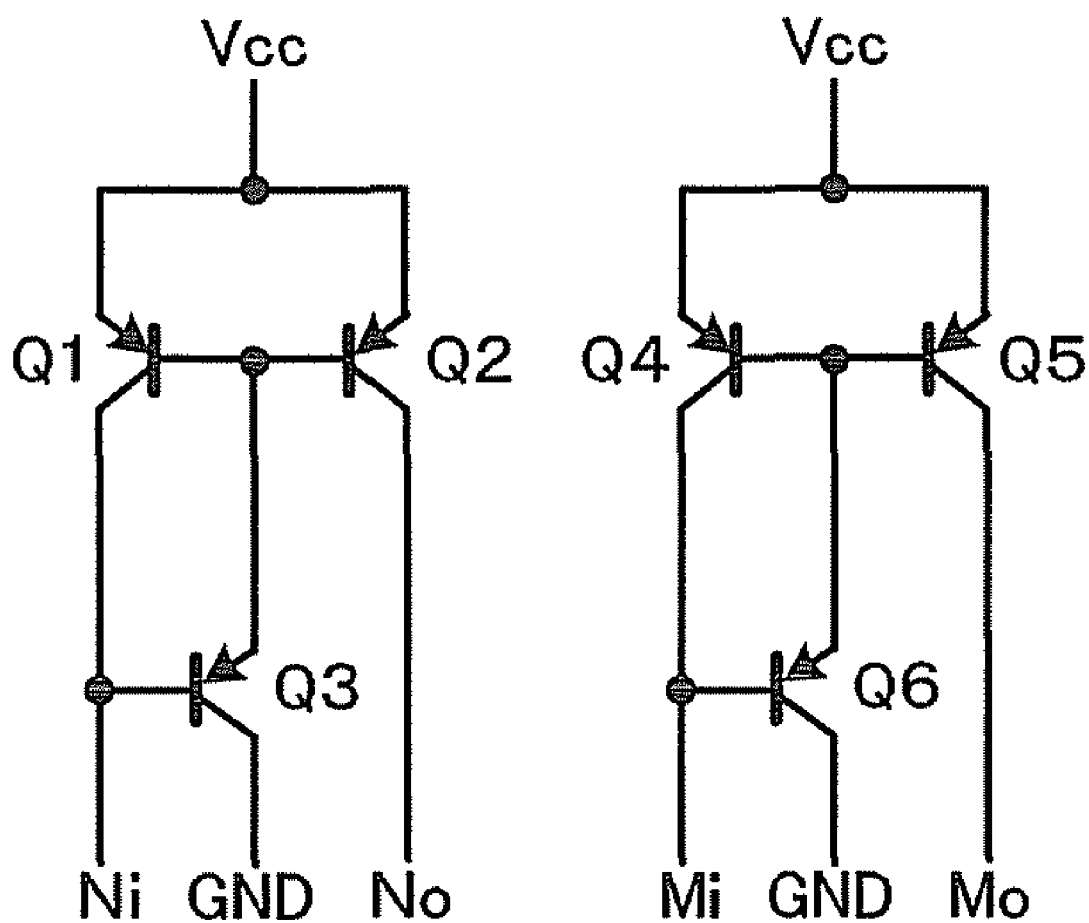
FIG. 8 is a circuit diagram showing an example of the configuration of a current mirror unit.

The current mirror unit 133 outputs currents In1 and Im1 corresponding to the currents In0 and Im0 at the input ends Ni and Mi to output ends No and Mo. The currents In1 and Im1 at the output ends No and Mo vary in proportional to the currents In0 and Im0 at the input ends Ni and Mi of the current mirror unit 133, respectively. FIG. 8 shows an example of the current mirror unit 133. In this diagram, the current mirror unit 133 includes first and second current mirror circuits which are composed of transistors Q1 to Q3 and Q4 to Q6 respectively.

The resistors 134 and 135 in combination function as a conversion unit which converts current into voltage. Further, the resistors 134 and 135 individually function as conversion elements which convert current into voltage. The currents In1 and Im1 outputted from the output ends No and Mo flow to the ground via the resistors 134 and 135, respectively. The resistors 134 and 135 convert the currents into the voltages, whereby the output terminals 136 and 137 output the voltages with reference to the potential of the ground. As has been described, the currents In1 and Im1 are limited to the combination of (H, L) or (L, H), so that the voltages outputted to the output terminals 136 and 137 are essentially limited to the combination of (H, L) or (L, H).

By using the current source 132 and the current mirror unit 133, the output at a constant potential independent of the power supply voltage Vcc can be obtained even when the power supply voltage Vcc of the comparator 130 is within a wide range. This makes it easy to use a CMOS having a relatively low withstand voltage in a logic circuit of the output circuit 140 at the subsequent stage. As a result, the power consumption can be easily reduced.

(Configuration of Output Circuit 140)

Figure 9:
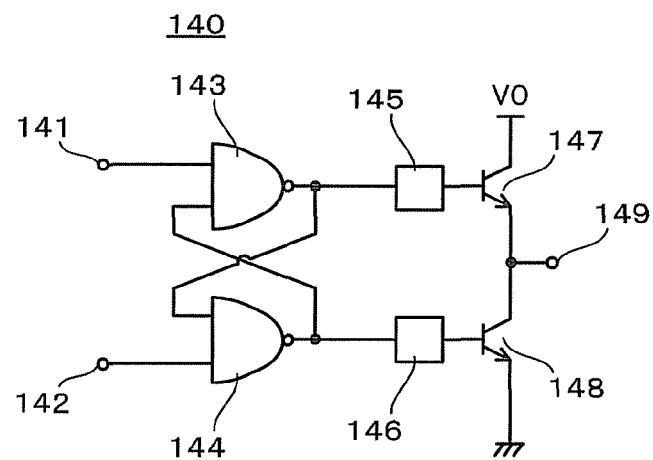
FIG. 9 is a circuit diagram showing an example of the configuration of an output circuit.

FIG. 9 is a circuit diagram showing an example of the configuration of the output circuit 140. The output circuit 140 has input terminals 141 and 142, logic elements 143 and 144, level converters 145 and 146, transistor 147 and 148, and an output terminal 149.

The output terminals 136 and 137 of the comparator 130 are connected to the input terminals 141 and 142 respectively to input signals to them. The voltages inputted into the input terminals 141 and 142 are essentially limited to the combination of (H, L) or (L, H).

The logic elements 143 and 144 are NAND elements. The logic element 143 outputs a negative logical product (NAND) of the outputs of the input terminal 141 and the logic element 144. The logic element 144 outputs a negative logical product (NAND) of the outputs of the input terminal 142 and the logic element 143. The logic elements 143 and 144 are analogous to an RS flipflop (different only in the presence of inverter (NOT element) on the input side) and essentially output only either the combination of (H, L) or (L, H).

The logic elements 143 and 144 can be composed of CMOS elements. The CMOS element is usually used for a logic circuit such as NAND or NOR. In a digital use to output Low or High level, the configuration is simplified through use of the logic circuit. The logic circuit can be composed even of a bipolar element, but it consumes a large power. Therefore, when a reduction in power consumption is required, the logic circuit is better composed using the CMOS element as much as possible. In this embodiment, the output at a constant potential can be obtained from the comparator 130 even when the power supply voltage Vcc is within a wide range. This makes it possible to use a CMOS having a relatively low withstand voltage to constitute a light receiving circuit 100 which is usable in a wide range.

However, when the logic elements 143 and 144 are composed of the CMOS elements, the power supply voltage to drive the logic elements 143 and 144 is preferably made constant by a regulator (a voltage converter) or the like. The CMOS elements operate even at a low power supply voltage, so that the power supply voltage for the CMOS elements can be easily generates from the regulator even when the power supply voltage Vcc before conversion by the regulator or the like is low.

The level converters 145 and 146 adjust the levels (DC components (biases)) of the outputs from the logic elements 143 and 144 to correspond to the transistors 147 and 148.

The transistors 147 and 148 are connected in series to be constituted in a totem-pole. Upon input of the combination of the transistors 147 and 148 (H, L), the output terminal 149 is brought to the voltage V0. Upon input of the combination of the transistors 147 and 148 (L, H), the output terminal 149 is brought to the ground potential.

Note that both of the transistors 147 and 148 shown in FIG. 9 are bipolar transistors. One or both of the transistors 147 and 148 may be composed of a field effect transistor (for example, a MOS (Metal Oxide Semiconductor)-FET). Further, in place of the totem-pole, the transistors 147 and 148 may be in complementary connection.

The logic elements 143 and 144 are connected as shown in FIG. 9 to constitute a flipflop to thereby suppress the shoot-through current at the transistors 147 and 148. The shoot-through current is a current directing toward the ground from the power supply of the transistors 147 and 148 and is generated when both of the transistors 147 and 148 are turned on. As has been described, the voltages inputted into the input terminals 141 and 142 are limited to (H, L) or (L, H), and a combination of (H, H) does not exists in principle. However, the combination of (H, H) may transiently occur at changeover between (H, L) and (L, H) and may be inputted into the input terminals 141 and 142. The logic elements 143 and 144 constitute the flipflop to ensure synchronization of changeover between (H, L) and (L, H) on the output sides of the logic elements 143 and 144. In other words, after the input sides of the logic elements 143 and 144 get out of the transient states and fixed, the voltages on the output sides change almost at the same time.

As has been described, the logic elements 143 and 144 constitute the flipflop to thereby prevent occurrence of the shoot-through current at the transistors 147 and 148 during changeover between the H and L of the signals (at switching of the transistors 147 and 148). The shoot-through current can be suppressed to reduce the power consumption.
(Other Embodiments)

The embodiment of the present invention is not limited to the above-describe embodiment, but can be extended or changed, and the extended and changed embodiments are also included in the technical scope of the present invention.

What is claimed is:
1. A light receiving circuit, comprising:
 a trans impedance amplifier circuit which is connected to a light receiving element;
 a current source which supplies a predetermined current;
 a differential amplifier which operates by the predetermined current to output a current corresponding to a differential signal between a signal outputted from the trans impedance amplifier circuit and a predetermined reference signal;
 a current mirror unit which outputs a current corresponding to the current outputted from the differential amplifier;
 a conversion unit which converts the current outputted from the current mirror unit into voltage, comprising first and second conversion elements connected to the current mirror unit;
 a first logic element comprising a first input end connected to the first conversion element, a second input end, and a first output end to output a negative logical product of signals inputted into the first and second input ends; and
 a second logic element comprising a third input end connected to the second conversion element, a fourth input end connected the first output end, and a second output end to output a negative logical product of signals inputted into the third and fourth input ends and connected to the second input end.

2. The light receiving circuit as set forth in claim 1, wherein the differential amplifier has a three-terminal element,
 the three-terminal element comprises a base or a gate to which the signal outputted from the trans impedance amplifier circuit is inputted, a collector or a drain, and an emitter or a source connected to the current source.

3. The light receiving circuit as set forth in claim 2,
 wherein the current mirror unit has a current mirror circuit,
 the current mirror circuit having one end which is connected to the collector or the drain of the three-terminal element and another end which outputs a current corresponding to a current flowing through the one end.

4. The light receiving circuit as set forth in claim 2, wherein the differential amplifier further has a second three-terminal element,
 the second three-terminal element comprises a base or a gate which is connected to the reference signal, a collector or a drain, and an emitter or a source connected to the current source.

5. The light receiving circuit as set forth in claim 4,
 wherein the current mirror unit has a current mirror circuit,
 the current mirror circuit has one end which is connected to the collector or the drain of the three-terminal element and another end which outputs a current corresponding to a current flowing through the one end.

6. The light receiving circuit as set forth in claim 5, wherein the current mirror unit has a second current mirror circuit,
 the second current mirror circuit has one end which is connected to the collector or the drain of the second three-terminal element and another end which outputs a current corresponding to a current flowing through the one end.

7. The light receiving circuit as set forth in claim 6, wherein:
 first conversion element is connected to the other end of the first current mirror circuit; and
 the second conversion element is connected to the other end of the second current mirror circuit.

8. The light receiving circuit as set forth in claim 1, further comprising:
a third and a fourth three-terminal element which are connected to the first and second output ends respectively, and connected to each other in series.

9. The light receiving circuit as set forth in claim 1, wherein the trans impedance amplifier circuit has a current source load which is connected to a power supply to supply a predetermined current.

10. The light receiving circuit as set forth in claim 9, wherein the trans impedance amplifier circuit further has a three-terminal element,
the three-terminal element has a base or a gate which is connected to the light receiving element, a collector or a drain which is connected to the current source load, and an emitter or a source which is connected to a ground.

11. The light receiving circuit as set forth in claim 10, wherein the trans impedance amplifier circuit further has a second three-terminal element,
the second three-terminal element has a base or a gate which is connected to the collector or the drain of the three-terminal element, a collector or a drain which is connected to a predetermined power supply, and an emitter or a source.

12. The light receiving circuit as set forth in claim 11, wherein the trans impedance amplifier circuit further has a resistor or a second current source load which connects the emitter or the source of the second three-terminal element to the ground.

13. The light receiving circuit as set forth in claim 12, wherein the trans impedance amplifier circuit further has a feedback circuit,
the feedback circuit has one end which is connected to the emitter or the source of the second three-terminal element and another end which is connected to the base or the gate of the three-terminal element.

14. The light receiving circuit as set forth in claim 13, wherein the feedback circuit has a resistor which connects the one end and the other end.

15. The light receiving circuit as set forth in claim 13, wherein the feedback circuit has:
a first and a second resistor which connect the one end and the other end; and
a third resistor and a capacitor which connect a connection portion of the first and second resistors and the ground in series.

16. The light receiving circuit as set forth in claim 1, further comprising:
a light receiving element.

17. The light receiving circuit as set forth in claim 1, wherein the light receiving element has:
a semiconductor substrate of a first conductive type;
a first semiconductor region of a second conductive type disposed on the semiconductor substrate;
a second semiconductor region of the first conductive type disposed around the first semiconductor region on the semiconductor substrate; and
third semiconductor region of the first conductive type disposed on the first semiconductor region.

18. The light receiving circuit as set forth in claim 17, wherein the light receiving element has:
a wiring conductor which connects the second and third semiconductor regions, the wiring conductor being connected to a grand or a constant potential; and
a connection portion which connects the first semiconductor region and the trans impedance amplifier circuit.

* * * * *